(12) United States Patent
Ting Liu et al.

(10) Patent No.: US 12,136,919 B2
(45) Date of Patent: Nov. 5, 2024

(54) PRE-DRIVER CIRCUIT AND DRIVER DEVICE

(71) Applicant: REALTEK SEMICONDUCTOR CORPORATION, Hsinchu (TW)

(72) Inventors: Yi Ting Liu, Hsinchu (TW); Zhixian Gao, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 160 days.

(21) Appl. No.: 17/936,077

(22) Filed: Sep. 28, 2022

(65) Prior Publication Data
US 2023/0155580 A1    May 18, 2023

(30) Foreign Application Priority Data
Nov. 15, 2021   (CN) .......................... 202111346394.2

(51) Int. Cl.
*H03K 3/356*    (2006.01)
*H03K 19/0185*  (2006.01)

(52) U.S. Cl.
CPC .  *H03K 3/35613* (2013.01); *H03K 19/018521* (2013.01)

(58) Field of Classification Search
None
See application file for complete search history.

(56) References Cited

U.S. PATENT DOCUMENTS

| 2010/0237816 A1 | 9/2010 | Seki et al. | |
| 2014/0285130 A1* | 9/2014 | Inoue | H03K 17/06 |
| | | | 318/400.29 |

* cited by examiner

*Primary Examiner* — Jany Richardson
(74) *Attorney, Agent, or Firm* — WPAT, P.C.; Anthony King (57) ABSTRACT

The present disclosure discloses a pre-driver circuit and a driving device. The pre-driver circuit includes a first transistor, a second transistor, and a resistive component. The first transistor has a first terminal coupled to a first voltage, a second terminal for outputting a pre-driving signal, and a control terminal for receiving a first control signal. The second transistor has a first terminal coupled to the second terminal of the first transistor, a second terminal coupled to a second voltage, and a control terminal for receiving the first control signal. The resistive component has a first terminal coupled to the first terminal of the second transistor, and a second terminal coupled to the second terminal of the second transistor. One of the first transistor and the second transistor is a P-type transistor, and the other is an N-type transistor.

18 Claims, 6 Drawing Sheets

PRE-DRIVER CIRCUIT AND DRIVER DEVICE

CROSS-REFERENCE TO RELATED APPLICATIONS

This application claims priority of China application No. 202111346394.2, filed on Nov. 15, 2021, which is incorporated by reference in its entirety.

TECHNICAL FIELD

The present application relates to a pre-driver circuit, particularly to a pre-driver circuit capable of providing a low swing signal for driving the main driver circuit.

BACKGROUND

Since the power driver circuit is often used to control a larger voltage or current output, in order to effectively and quickly control the power driver circuit, a pre-driver circuit is often used to generate a control signal to control the power driver circuit. In the prior art, the pre-driver circuit is often implemented with inverters. However, the output of the inverter is generally in a full swing between its power supply voltage and the ground voltage, thereby causing higher instability to the system at the moment when the signal changes.

For example, if the pre-driver circuit and the power driver circuit use the same power supply voltage and the same ground voltage, then during the process when the input signal of the inverter changes, and the inverter changes the pre-driving signal in a full swing manner, the pre-driver circuit and the power driver circuit may generate a leakage current, and cause noise in the power supply voltage or ground voltage, thereby affecting the stability of the system. Therefore, how to control the power driver circuit and maintain the stability of the system has become an issue to be solved.

SUMMARY OF THE INVENTION

One embodiment of the present disclosure discloses a pre-driver circuit configured to provide a pre-driving signal to drive a main driver circuit. The pre-driver circuit includes a first transistor, a second transistor, and a resistive component. The first transistor has a first terminal, a second terminal and a control terminal. The first terminal of the first transistor is coupled to a first voltage, the second terminal of the first transistor is configured to output the pre-driving signal, and the control terminal of the first transistor is configured to receive a first control signal. The second transistor has a first terminal, a second terminal and a control terminal. The first terminal of the second transistor is coupled to the second terminal of the first transistor, the second terminal of the second transistor is coupled to a second voltage, and the control terminal of the second transistor is configured to receive the first control signal. The resistive component has a first terminal and a second terminal, wherein the first terminal of the resistive component is coupled to the first terminal of the second transistor is, and the second terminal of the resistive component is coupled to the second terminal of the second transistor. One of the first transistor and the second transistor is a P-type transistor, and the other is an N-type transistor.

Another embodiment of the present disclosure discloses a driving device. The driving device includes a first pre-driver circuit and a main driver circuit. The pre-driver circuit includes a first transistor, a second transistor, and a resistive component. The first transistor has a first terminal, a second terminal and a control terminal. The first terminal of the first transistor is coupled to a first voltage, the second terminal of the first transistor is configured to output the first pre-driving signal, and the control terminal of the first transistor is configured to receive a first control signal. The second transistor has a first terminal, a second terminal and a control terminal. The first terminal of the second transistor is coupled to the second terminal of the first transistor, the second terminal of the second transistor is coupled to a second voltage, and the control terminal of the second transistor is configured to receive the first control signal. The first resistive component has a first terminal and a second terminal, wherein the first terminal of the first resistive component is coupled to the first terminal of the second transistor, and the second terminal of the first resistive component is coupled to the second terminal of the second transistor. The main driver circuit includes a third transistor having a first terminal, a second terminal and a control terminal. The first terminal of the third transistor is configured to receive a power supply, the second terminal of the third transistor is configured to output a first output signal, and the control terminal of the third transistor is configured to receive the first pre-driving signal. One of the first transistor and the second transistor is a P-type transistor, and the other is an N-type transistor. Since the pre-driver circuits and driving devices can generate a signal having a smaller voltage swing according to the control signal to drive the main driver circuit, thereby reducing the current ripple generated by the pre-driver circuit, which in turn reduces the situation that the system voltage swings rigorously. Furthermore, since the voltage swing of the pre-driving signal is smaller, the time required to charge or discharge the gate capacitor of the main driver circuit is also reduced, thereby increasing the on/off speed of the main driver circuit.

DETAILED DESCRIPTION

Figure 1:
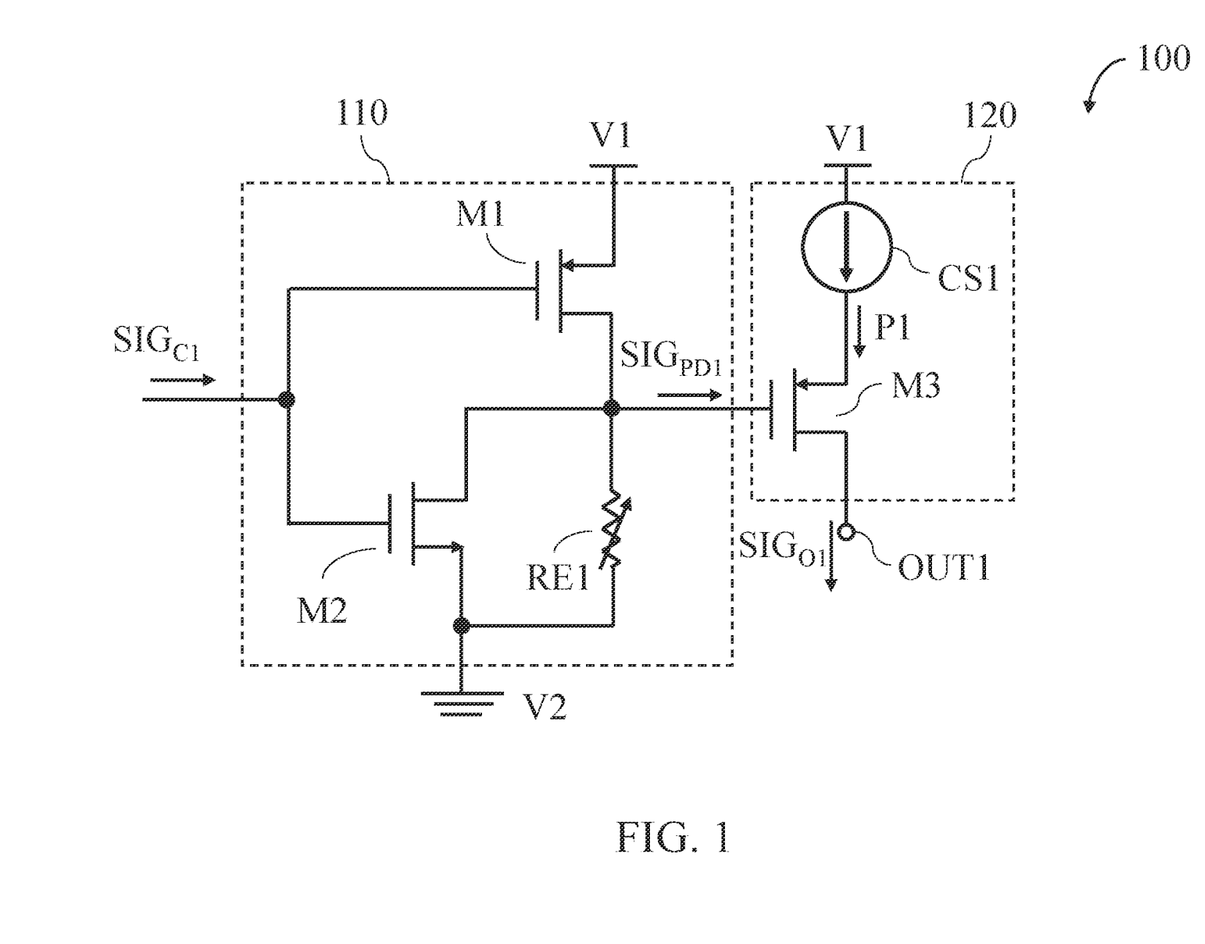
FIG. 1 is a schematic diagram illustrating a driving device according to one embodiment of the present disclosure.

FIG. 1 is a schematic diagram illustrating a driving device 100 according to one embodiment of the present disclosure. The driving device 100 includes a first pre-driver circuit 110 and a main driver circuit 120. In the present embodiment, the first pre-driver circuit 110 can receive a first control signal $SIG_{C1}$, and can generate a first pre-driving signal $SIG_{PD1}$ having a smaller signal swing to drive the main driver circuit 120 according to the first control signal $SIG_{C1}$. Since the first pre-driving signal $SIG_{PD1}$ has a smaller signal swing, ripples of currents generated by the first pre-driver circuit 110 is also smaller, thereby increasing the stability of the system voltage.

In FIG. 1, the first pre-driver circuit 110 includes a first transistor M1, a second transistor M2 and a first resistive component RE1. The first transistor M1 has a first terminal, a second terminal and a control terminal; the first terminal of the first transistor M1 can be coupled to a first voltage V1, the second terminal of the first transistor M1 can output the first pre-driving signal $SIG_{PD1}$, and the control terminal of the first transistor M1 can receive the first control signal $SIG_{C1}$. The second transistor M2 has a first terminal, a second terminal and a control terminal; the first terminal of the second transistor M2 can be coupled to the second terminal of the first transistor M1, the second terminal of the second transistor M2 can be coupled to a second voltage V2, and the control terminal of the second transistor M2 can receive the first control signal $SIG_{C1}$. The first resistive component RE1 has a first terminal and a second terminal; the first terminal of the first resistive component RE1 can be coupled to the first terminal of the second transistor M2, and the second terminal of the first resistive component RE1 can be coupled to the second terminal of the second transistor M2. Furthermore, the first voltage V1 can be higher than the second voltage V2; for example, the first voltage V1 can be the operating voltage of the system, and the second voltage V2 can be the ground voltage.

The main driver circuit 120 includes the third transistor M3; the third transistor M3 has a first terminal, a second terminal and a control terminal. The first terminal of the third transistor M3 can receive the power supply P1. The second terminal of the third transistor M3 can output the first output signal $SIG_{O1}$, and the control terminal of the third transistor M3 can receive the first pre-driving signal $SIG_{PD1}$. In the present embodiment, the driving device 100 can further include a first current source CS1, wherein the first current source CS1 can be coupled to the first terminal of the third transistor M3 and can be configured to provide a power supply P1. In such case, the driving device 100 can correspondingly output the first output signal $SIG_{O1}$ according to the voltage level of the first control signal $SIG_{C1}$, and the first output signal $SIG_{O1}$ outputted by the driving device 100 is substantially the power supply P1 provided by the first current source CS1.

In the present embodiment, the first transistor M1 and the third transistor M3 can be P-type transistors, and the second transistor M3 can be an N-type transistor. In such case, when the first control signal $SIG_{C1}$ is at a logic high level, the first transistor M1 will be turned off, and the second transistor M2 is turned on; at this time, the voltage of the first pre-driving signal $SIG_{PD1}$ equals substantially to the second voltage V2, so that the third transistor M3 is turned on.

Figure 2:
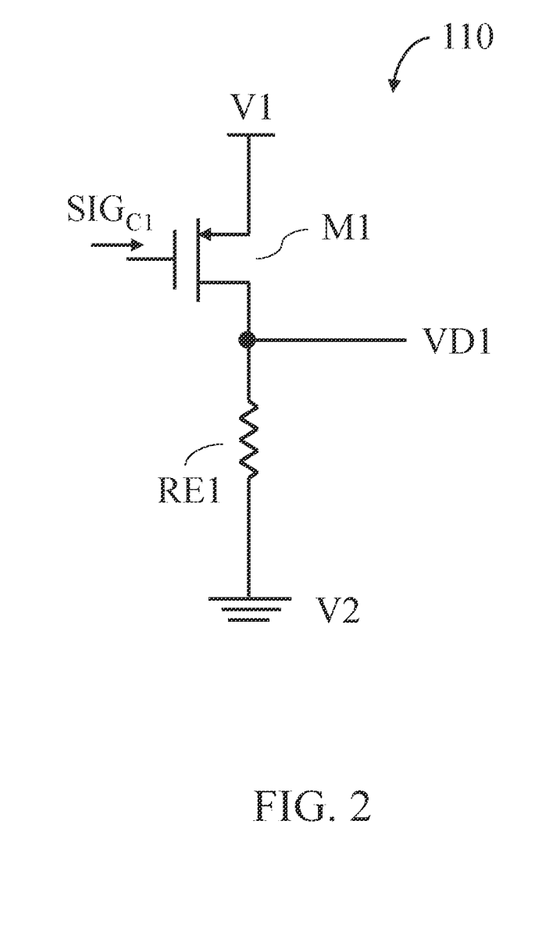
FIG. 2 is an equivalent circuit of the first pre-driver circuit in FIG. 1 when a first control signal is at a logic low level.

In contrast, when the first control signal $SIG_{C1}$ is at a logic low level, the first transistor M1 is turned on, and the second transistor M2 is turned off. FIG. 2 illustrates an equivalent circuit of the first pre-driver circuit 110 when the first control signal $SIG_{C1}$ is at a logic low level. In FIG. 2, the voltage of the first pre-driving signal $SIG_{PD1}$ is a divisional voltage VD1 provided by the first resistive component RE1 and the first transistor M1, and the divisional voltage VD1 can be expressed as Equation (1).

$$VD1 = \frac{R1}{R1 + RON_{M1}}(V1 - V2) \quad \text{Equation (1)}$$

In Equation (1), R1 is the resistance of the first resistive component RE1, and $RON_{M1}$ is the on-resistance of the first transistor M1. In the present embodiment, the resistance R1 of the first resistive component RE1 is higher than the on-resistance $RON_{M1}$ of the first transistor M1. By selecting the resistance R1 of the first resistive component RE1 appropriately, it is feasible to make the divisional voltage VD1 higher than the voltage at the first terminal of the third transistor M3 minus a threshold voltage of the third transistor M3, thereby turning off the third transistor M3. For example, in FIG. 1, the first resistive component RE1 may include a variable resistor, and hence, a user may adjust the resistance R1 of the first resistive component RE1 depending on his/her needs. However, the present disclosure is not limited thereto, in some embodiments, when a user already knows the appropriate resistance R1, he/she can also use an invariable resistor having a corresponding resistance to implement the first resistive component RE1.

In the present embodiment, a logic high level of the first control signal $SIG_{C1}$ may, for example, equal to the first voltage V1, and a logic low level of the first control signal $SIG_{C1}$ may, for example, equal to the second voltage V2. In other words, the voltage swing of the first control signal $SIG_{C1}$ is the difference between the first voltage V1 and the second voltage V2. In contrast, the voltage swing of the first pre-driving signal $SIG_{PD1}$ is the difference between the divisional voltage VD1 and the second voltage V2; i.e., the voltage drop of the two terminals of the first resistive component RE1. As shown in Equation (1), the divisional voltage VD1 is lower than the difference between the first voltage V1 and the second voltage V2, and hence, the voltage swing of first pre-driving signal $SIG_{PD1}$ can be lower than the voltage swing of the first control signal $SIG_{C1}$.

In other words, the main driver circuit 120 may use the first pre-driving signal $SIG_{PD1}$ having a smaller voltage swing to control the output of the power supply P1 so as to reduce the current ripples generated by the first pre-driver circuit 110, thereby reducing the situation that the first voltage V1 and the second voltage V2 swing rigorously. Furthermore, since the voltage swing of the first pre-driving signal $SIG_{PD1}$ is smaller, the time required to charge or discharge the gate capacitor of the third transistor M3 can also be shortened when the signal voltage changes, thereby increasing the on/off speed of the main driver circuit 120.

Figure 3:
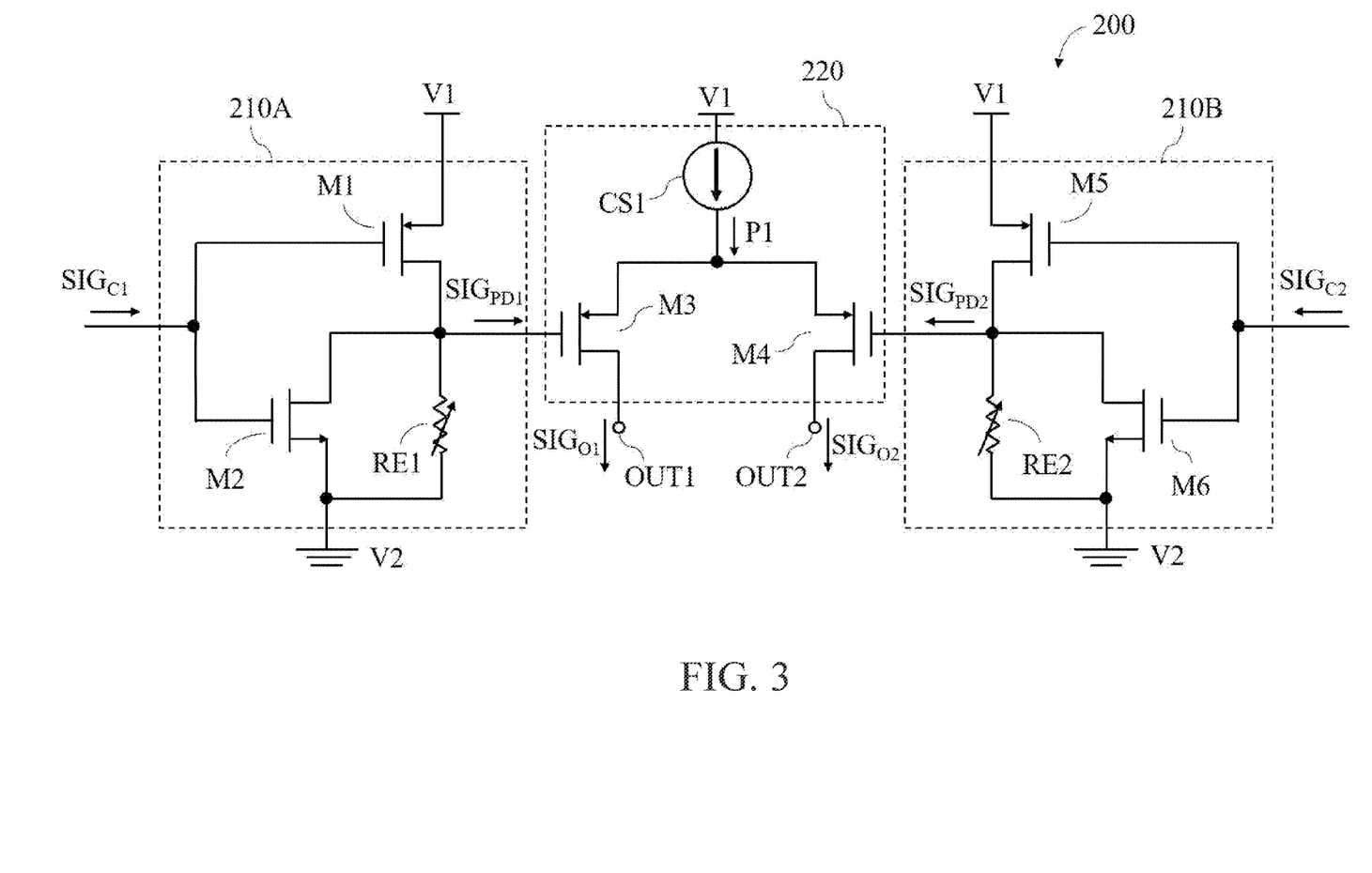
FIG. 3 is a schematic diagram illustrating a driving device according to another embodiment of the present disclosure.

FIG. 3 is a schematic diagram illustrating a driving device 200 according to another embodiment of the present disclosure. The driving device 200 and the driving device 100 of FIG. 1 have similar structures and may operate according to similar principles; however, in the driving device 200, the main driver circuit 220 can output two output signals: the first output signal $SIG_{O1}$ and the second output signal $SIG_{O2}$. The main driver circuit 220 can include a third transistor M3 and a fourth transistor M4; the third transistor M3 and the fourth transistor M4 may respectively receive a first pre-driving signal $SIG_{PD1}$ generated by the first pre-driver circuit 210A and a second pre-driving signal $SIG_{PD2}$ generated by the second pre-driver circuit 210B. As shown in FIG. 3, the fourth transistor M4 has a first terminal, a second terminal and a control terminal, wherein the first terminal of the fourth transistor M4 can receive the power supply P1, the second terminal of the fourth transistor M4 can output the second output signal $SIG_{O2}$, and the control terminal of the fourth transistor M4 can receive a second pre-driving signal $SIG_{PD2}$.

In the present embodiment, the first pre-driver circuit 210A may generate the first pre-driving signal $SIG_{PD1}$ according to a first control signal $SIG_{C1}$, and the second pre-driver circuit 210B may generate second pre-driving signal $SIG_{PD2}$ according to a second control signal $SIG_{C2}$. Furthermore, the second pre-driver circuit 210B may have a similar structure as the first pre-driver circuits 110 and 210A, and may operate according to similar principles adopted by the first pre-driver circuit 110 and 210A. As shown in FIG. 3, the second pre-driver circuit 210B includes a fifth transistor M5, a sixth transistor M6 and a second resistive component RE2. The fifth transistor M5 has a first terminal, a second terminal and a control terminal, the first terminal of the fifth transistor M5 can be coupled to the first voltage V1, the second terminal of the fifth transistor M5 can output second pre-driving signal $SIG_{PD2}$, and the control terminal of the fifth transistor M5 can receive the second control signal $SIG_{C2}$. In the present embodiment, the first control signal $SIG_{C1}$ and the second control signal $SIG_{C2}$ are complementary.

The sixth transistor M6 has a first terminal, a second terminal and a control terminal, the first terminal of the sixth transistor M6 can be coupled to the second terminal of the fifth transistor M5, the second terminal of the sixth transistor M6 can be coupled to the second voltage V2, and the control terminal of the sixth transistor M6 can receive the second control signal $SIG_{C2}$. The second resistive component RE2 has a first terminal and a second terminal, the first terminal of the second resistive component RE2 can be coupled to the first terminal of the sixth transistor M6, and the second terminal of the second resistive component RE2 can be coupled to the second terminal of the sixth transistor M6.

In the present embodiment, the fourth transistor M4 and the fifth transistor M5 can be P-type transistors, and the sixth transistor M6 can be an N-type transistor. In such case, when the second control signal $SIG_{C2}$ is at a logic high level, the fifth transistor M5 will be turned off, the sixth transistor M6 is turned on; at this time, the voltage of the second pre-driving signal $SIG_{PD2}$ equals substantially to the second voltage V2, so that the fourth transistor M4 is turned on, and the main driver circuit 220 outputs the second output signal $SIG_{O2}$ through the second output terminal OUT2. Since the first control signal $SIG_{C1}$ and the second control signal $SIG_{C2}$ are complementary, when the second control signal $SIG_{C2}$ is at the logic high level, the first control signal $SIG_{C1}$ will be at the logic low level, and hence, the third transistor M3 will be turned off, and the main driver circuit 220 will stop outputting the first output signal $SIG_{O1}$ via the first output terminal OUT1.

In contrast, when the second control signal $SIG_{C2}$ is at the logic low level, the sixth transistor M6 will be turned off, and the fifth transistor M5 is turned on; at this time, the voltage of the second pre-driving signal $SIG_{PD2}$ equals substantially to the divisional voltage provided by the fifth transistor M5 and the second resistive component RE2. By selecting the resistance of the second resistive component RE2 appropriately, the voltage of the second pre-driving signal $SIG_{PD2}$ can be higher than the voltage at the first terminal of the fourth transistor M4 minus the threshold voltage of the fourth transistor M4; therefore, the fourth transistor M4 is turned off, and the main driver circuit 220 will stop outputting the second output signal $SIG_{O2}$ via the second output terminal OUT2. Since the first control signal $SIG_{C1}$ and the second control signal $SIG_{C2}$ are complementary, when the second control signal $SIG_{C2}$ is at a logic low level, the first control signal $SIG_{C1}$ will be at a logic high level, the third transistor M3 will be turned on, and the main driver circuit 220 can output the first output signal $SIG_{O1}$ via the first output terminal OUT1.

Figure 4:
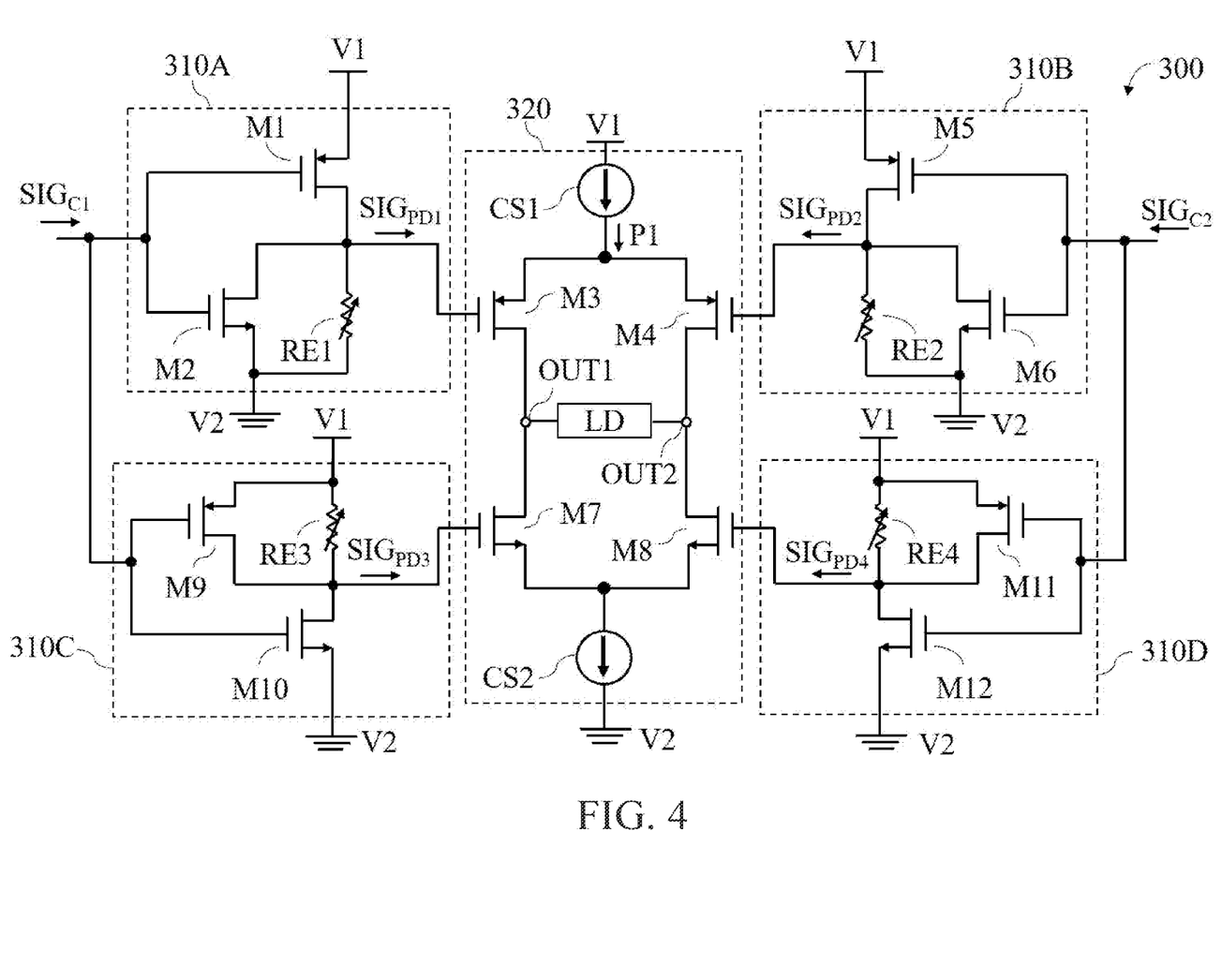
FIG. 4 is a schematic diagram illustrating a driving device according to another embodiment of the present disclosure.

FIG. 4 is a schematic diagram illustrating a driving device 300 according to another embodiment of the present disclosure. The driving device 300 and the driving device 200 have similar structures and may operate according to similar principles. The driving device 300 may include a first pre-driver circuit 310A, a second pre-driver circuit 310B, a third pre-driver circuit 310C, a fourth pre-driver circuit 310D, and a main driver circuit 320. In the present embodiment, the main driver circuit 320 can include a third transistor M3, a fourth transistor M4, a seventh transistor M7 and an eighth transistor M8, wherein the third transistor M3, the fourth transistor M4, the seventh transistor M7 and the eighth transistor M8 can respectively receive a first pre-driving signal $SIG_{PD1}$ generated by the first pre-driver circuit 310A, a second pre-driving signal $SIG_{PD2}$ generated by the second pre-driver circuit 310B, a third pre-driving signal $SIG_{PD3}$ generated by the third pre-driver circuit 310C and a fourth pre-driving signal $SIG_{PD4}$ generated by the fourth pre-driver circuit 310D.

As shown in FIG. 4, the seventh transistor M7 has a first terminal, a second terminal and a control terminal, wherein the first terminal of the seventh transistor M7 can be coupled to the second terminal of the third transistor M3, and the control terminal of the seventh transistor M7 can receive the third pre-driving signal $SIG_{PD3}$. The eighth transistor M8 has a first terminal, a second terminal and a control terminal, wherein the first terminal of the eighth transistor M8 can be coupled to the second terminal of the fourth transistor M4, and the control terminal of the eighth transistor M8 can receive the fourth pre-driving signal $SIG_{PD4}$. In the present embodiment, the driving device 300 can further include a second current source CS2. The second current source CS2 can be coupled to the second terminal of the seventh transistor M7 and the second terminal of the eighth transistor M8. In such case, the first current source CS1 and the second current source CS2 can generate currents having the same level, which can be used to provide the power supply P1 together.

In the present embodiment, the first pre-driver circuit 310A can generate the first pre-driving signal $SIG_{PD1}$ according to the first control signal $SIG_{C1}$, the second pre-driver circuit 310B can generate the second pre-driving signal $SIG_{PD2}$ according to the second control signal $SIG_{C2}$, the third pre-driver circuit 310C can generate the third pre-driving signal $SIG_{PD3}$ according to the first control signal $SIG_{C1}$, the fourth pre-driver circuit 310D can generate the fourth pre-driving signal $SIG_{PD4}$ according to the second control signal $SIG_{C2}$.

As shown in FIG. 4, the third pre-driver circuit 310C can include a ninth transistor M9, a tenth transistor M10 and a third resistive component RE3. The ninth transistor M9 has a first terminal, a second terminal and a control terminal, wherein the first terminal of the ninth transistor M9 can be coupled to the first voltage V1, the second terminal of the ninth transistor M9 can output the third pre-driving signal $SIG_{PD3}$, and the control terminal of the ninth transistor M9 can receive the first control signal $SIG_{C1}$. The tenth transistor M10 has a first terminal, a second terminal and a control terminal, wherein the first terminal of the tenth transistor M10 can be coupled to the second terminal of the ninth transistor M9, the second terminal of the tenth transistor M10 is coupled to the second voltage V2, and the control terminal of the tenth transistor M10 can receive the first control signal $SIG_{C1}$. The third resistive component RE3 has a first terminal and a second terminal, the first terminal of the third resistive component RE3 can be coupled to the first terminal of the ninth transistor M9, and the second terminal of the third resistive component RE3 can be coupled to the second terminal of the ninth transistor M9.

Furthermore, the fourth pre-driver circuit 310D can include an eleventh transistor M11, a twelfth transistor M12 and a fourth resistive component RE4. The eleventh transistor M11 has a first terminal, a second terminal and a control terminal, wherein the first terminal of the eleventh transistor M11 can be coupled to the first voltage V1, the second terminal of the eleventh transistor M11 can output the fourth pre-driving signal $SIG_{PD4}$, and the control terminal of the eleventh transistor M11 can receive the second control signal $SIG_{C2}$. The twelfth transistor M12 has a first terminal, a second terminal and a control terminal, wherein the first terminal of the twelfth transistor M12 can be coupled to the second terminal of the eleventh transistor M11, the second terminal of the twelfth transistor M12 is coupled to the second voltage V2, and the control terminal of the twelfth transistor M12 can receive the second control signal $SIG_{C2}$. The fourth resistive component RE4 has a first terminal and a second terminal, wherein the first terminal of the fourth resistive component RE4 can be coupled to the first terminal of the eleventh transistor M11, and the second terminal of the fourth resistive component RE4 can be coupled to the second terminal of the eleventh transistor M11.

Figure 5:
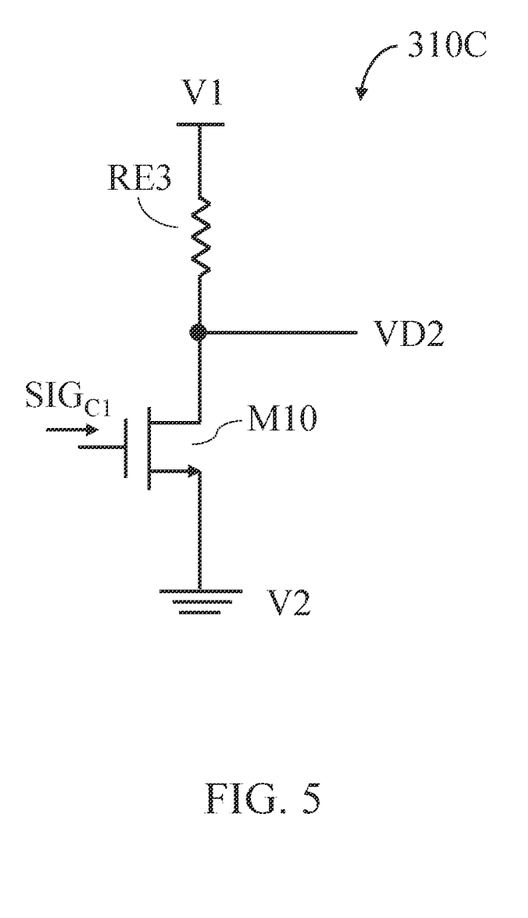
FIG. 5 is an equivalent circuit of the third pre-driver circuit in FIG. 4 when a first control signal is at a logic high level

In the present embodiment, the ninth transistor M9 and the eleventh transistor M11 are both P-type transistors, and the seventh transistor M7, the eighth transistor M8, the tenth transistor M10 and the twelfth transistor M12 are all N-type transistors. In such case, when the first control signal $SIG_{C1}$ is at the logic high level, the ninth transistor M9 is turned off, the tenth transistor M10 is turned on, and the voltage of the third pre-driving signal $SIG_{PD3}$ equals substantially to a divisional voltage provided by the third resistive component RE3 and the tenth transistor M10. FIG. 5 illustrates the equivalent circuit of the third pre-driver circuit 310C when the first control signal $SIG_{C1}$ is at the logic high level. In FIG. 5, the voltage of the third pre-driving signal $SIG_{PD3}$ is a divisional voltage VD2 provided by the third resistive component RE3 and the tenth transistor M10, and the divisional voltage VD2 can be expressed by Equation (2).

$$VD2 = \frac{RON_{M10}}{R3 + RON_{M10}}(V1 - V2) \quad \text{Equation (2)}$$

In Equation (2), R3 is the resistance of the third resistive component RE3, and $RON_{M10}$ is the on-resistance of the tenth transistor M10. In the present embodiment, the resistance R3 of the third resistive component RE3 is higher than the on-resistance $RON_{M10}$ of the tenth transistor M10, and by selecting the appropriate the resistance R3 of the third resistive component RE3, it is feasible to make the divisional voltage VD2 lower than the sum of the voltage at the first terminal of the seventh transistor M7 and the threshold voltage of the seventh transistor M7. In such case, when the first control signal $SIG_{C1}$ is at the logic high level, the seventh transistor M7 will be turned off.

Furthermore, when the first control signal $SIG_{C1}$ is at the logic high level, the second control signal $SIG_{C2}$ is at the logic low level; in such case, the eleventh transistor M11 is turned on, and the twelfth transistor M12 is turned off, and the voltage of the fourth pre-driving signal $SIG_{PD4}$ equals substantially to the first voltage V1, so that the eighth transistor M8 is turned on. Furthermore, according to the foregoing description regarding the embodiment of FIG. 2, when the first control signal $SIG_{C1}$ is at the logic high level, the third transistor M3 is turned on, and the fourth transistor M4 is turned off. In other words, when the first control signal $SIG_{C1}$ is at the logic high level, the third transistor M3 and the eighth transistor M8 of the driving device 300 are turned on, and the fourth transistor M4 and the seventh transistor M7 are turned off; hence, the current generated by the first current source CS1 will pass through the third transistor M3 and the first output terminal OUT1 into a load circuit LD, and then passing through the second output terminal OUT2 and the eighth transistor M8 into the second current source CS2. At this time, the voltage of the first output terminal OUT1 will be higher than the voltage of the second output terminal OUT2.

In contrast, when the first control signal $SIG_{C1}$ is at the logic low level, the ninth transistor M9 is turned on, the tenth transistor M10 is turned off, and the voltage of the third pre-driving signal $SIG_{PD3}$ equals substantially to the first voltage V1, so that the seventh transistor M7 is turned on. In other words, the voltage swing of the third pre-driving signal $SIG_{PD3}$ is the difference between the divisional voltage VD2 and the first voltage V1, i.e., the voltage drop across the two terminals of the third resistive component RE3, and is lower than the voltage swing of the first control signal $SIG_{C1}$.

Furthermore, when the first control signal $SIG_{C1}$ is at the logic low level, the second control signal $SIG_{C2}$ is at the logic high level; at this time, the eleventh transistor M11 is turned off, and the twelfth transistor M12 is turned on, and the voltage of the fourth pre-driving signal $SIG_{PD4}$ equals to a divisional voltage provided by the fourth resistive component RE4 and the twelfth transistor M12. In the present embodiment, by selecting the resistance R4 of the fourth resistive component RE4 appropriately, it is feasible to make the voltage of the fourth pre-driving signal $SIG_{PD4}$ lower than the sum of the voltage at the first terminal of the eighth transistor M8 and the threshold voltage of the eighth transistor M8, so as to turn off the eighth transistor M8.

Furthermore, according to the foregoing description regarding the embodiment of FIG. 3, when the first control signal $SIG_{C1}$ is at the logic low level, the third transistor M3 is turned off, however, the fourth transistor M4 is turned on. In other words, when the first control signal $SIG_{C1}$ is at the logic low level, the fourth transistor M4 and the seventh transistor M7 of the driving device 300 are turned on, and the third transistor M3 and the eighth transistor M8 are turned off; hence, the current generated by the first current source CS1 will pass through the fourth transistor M4 and the second output terminal OUT2 into the load circuit LD, and then passing through the first output terminal OUT1 and the seventh transistor M7 into the second current source CS2. In such case, the voltage of the second output terminal OUT2 will be higher than the voltage of the first output terminal OUT1. In other words, the driving device 300 can be an H-type driving device, and can output currents in opposite directions between the first output terminal OUT1 and the second output terminal OUT2 according to the changes of the first control signal $SIG_{C1}$ and the second control signal $SIG_{C2}$, and the first output signal $SIG_{O1}$ and second output signal $SIG_{O2}$ can be configured to be a pair of differential output signals.

In the present embodiment, the signal voltage swing of the first pre-driving signal $SIG_{PD1}$, the second pre-driving signal $SIG_{PD2}$, first pre-driving signal $SIG_{PD3}$ and first pre-driving signal $SIG_{PD4}$ can be lower than the signal voltage swing of the first control signal $SIG_{C1}$ and the second control signal $SIG_{C2}$, and hence, the current ripples generated by the first pre-driver circuit 310A, the second pre-driver circuit 310B, the third pre-driver circuit 310C and the fourth pre-driver circuit 310D are smaller, thereby reducing the situation that the first voltage V1 and the second voltage V2 swing rigorously. Furthermore, since the voltage swing of the first pre-driving signal $SIG_{PD1}$, the second pre-driving signal $SIG_{PD2}$, first pre-driving signal $SIG_{PD3}$ and first pre-driving signal $SIG_{PD4}$ is smaller, when the voltage of the first control signal $SIG_{C1}$ and the second control signal $SIG_{C2}$ changes, the time required to charge or discharge the gate capacitor of the third transistor M3, the fourth transistor M4, the seventh transistor M7 and the eighth transistor M8 can also be shortened, thereby increasing the on/off speed of the main driver circuit 320.

Figure 6:
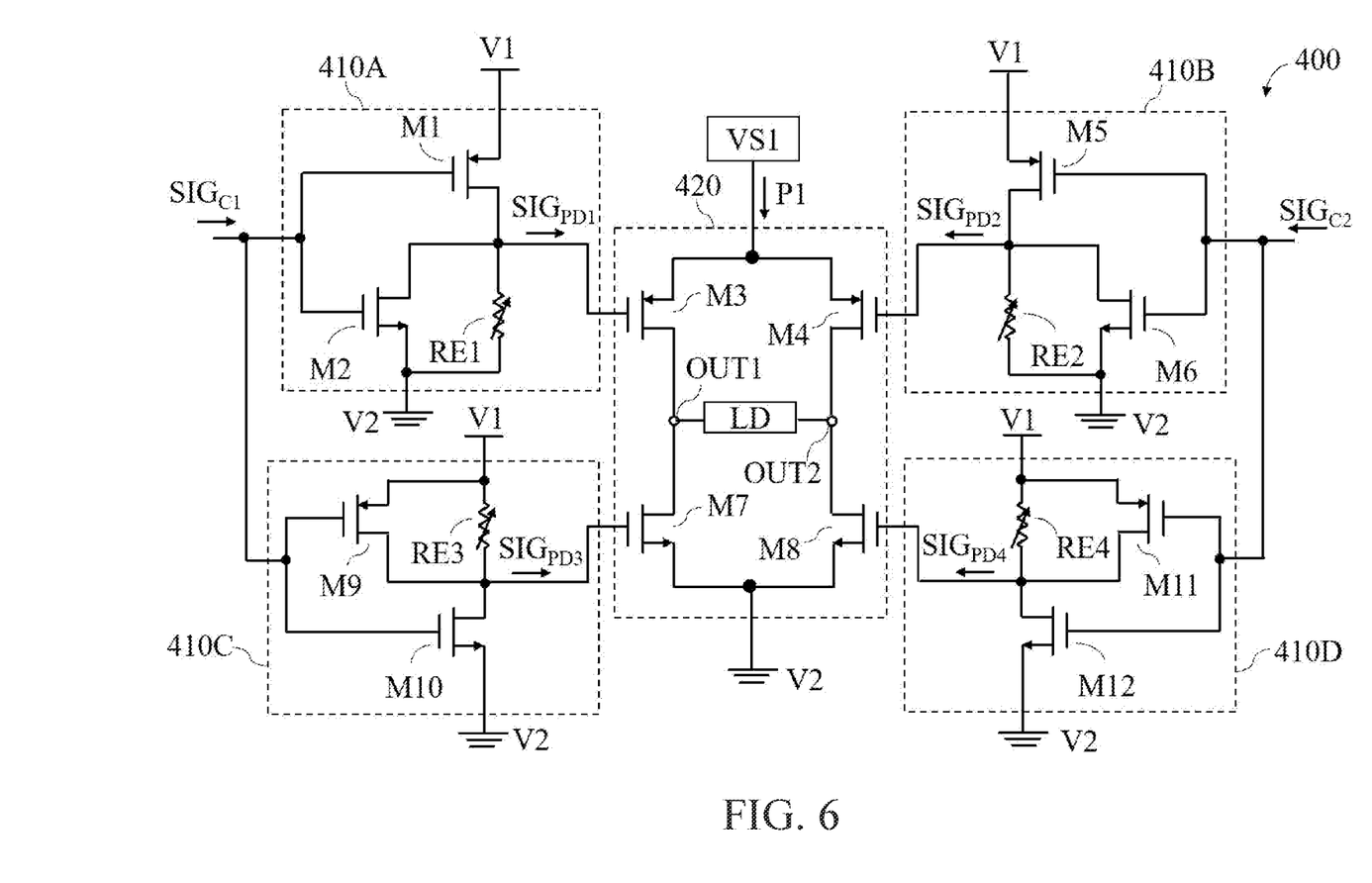
FIG. 6 is a schematic diagram illustrating a driving device according to another embodiment of the present disclosure.

Although the power supply P1 received from the driving device 100, 200 and 300 can be the current provided by the current source, the present disclosure is not limited thereto; in some embodiments, the driving device can also receive the voltage provided by a voltage source as the power supply. FIG. 6 is a schematic diagram illustrating a driving device 400 according to another embodiment of the present disclosure. The driving device 400 and the driving device 300 have similar structures and are able to operate according to similar principles; however, in FIG. 6, the driving device 400 can include a first voltage source VS1 instead of the current sources CS1 and CS2. The first voltage source VS1 can be coupled to the first terminal of the third transistor M3 and the first terminal of the fourth transistor M4, and can output the voltage as the power supply P1. In the present embodiment, the voltage provided by the first voltage source VS1 can be the first voltage V1. In such case, the first voltage source VS1 can also be provided to the first voltage V1 to the first pre-driver circuits 410A, 410B, 410C and 410D, and the main driver circuit 420 can output the first voltage V1 through the first output terminal OUT1 and output the second voltage V2 through the second output terminal OUT2 when the first control signal $SIG_{C1}$ is at a logic high level, and output the second voltage V2 through the first output terminal OUT1 and output the first voltage V1 through the second output terminal OUT2, when the second control signal $SIG_{C2}$ is at a logic low level, according to the pre-driving signals $SIG_{PD1}$, $SIG_{PD2}$, $SIG_{PD3}$ and $SIG_{PD4}$ generated by the first pre-driver circuits 410A, 410B, 410C and 410D. In other words, the driving device 400 can output voltage signals of opposite phases between the first output terminal OUT1 and the second output terminal OUT2 according to the changes of the first control signal $SIG_{C1}$ and the second control signal $SIG_{C2}$.

In summary, the pre-driver circuits and driving devices according to embodiments of the present disclosure can generate a signal having a smaller voltage swing according to the control signal to drive the main driver circuit, thereby reducing the current ripple generated by the pre-driver circuit, which in turn reduces the situation that the system voltage swings rigorously. Furthermore, since the voltage swing of the pre-driving signal is smaller, the time required to charge or discharge the gate capacitor of the main driver circuit is also reduced, thereby increasing the on/off speed of the main driver circuit.

What is claimed is:

1. A pre-driver circuit, configured to provide a pre-driving signal to drive a main driver circuit, comprising:
    a first transistor, having a first terminal, a second terminal and a control terminal, wherein the first terminal of the first transistor is coupled to a first voltage, the second terminal of the first transistor is configured to output the pre-driving signal, and the control terminal of the first transistor is configured to receive a first control signal;
    a second transistor, having a first terminal, a second terminal and a control terminal, wherein the first terminal of the second transistor is coupled to the second terminal of the first transistor, the second terminal of the second transistor is coupled to a second voltage, and the control terminal of the second transistor is configured to receive the first control signal; and
    a resistive component, having a first terminal and a second terminal, wherein the first terminal of the resistive component is coupled to the first terminal of the second transistor, and the second terminal of the resistive component is coupled to the second terminal of the second transistor;
    wherein one of the first transistor and the second transistor is a P-type transistor, and the other is an N-type transistor; and
    wherein a voltage swing of the pre-driving signal is smaller than a voltage difference between the first voltage and the second voltage.

2. The pre-driver circuit of claim 1, wherein:
    the first transistor is a P-type transistor, and the second transistor is an N-type transistor; and
    the first voltage is higher than the second voltage.

3. The pre-driver circuit of claim 1, wherein:
    the first transistor is an N-type transistor, and the second transistor is a P-type transistor; and
    the first voltage is lower than the second voltage.

4. A driving device, comprising:
    a first pre-driver circuit, comprising:
        a first transistor, having a first terminal, a second terminal and a control terminal, wherein the first terminal of the first transistor is coupled to a first voltage, the second terminal of the first transistor is configured to output a first pre-driving signal, and the control terminal of the first transistor is configured to receive a first control signal;
        a second transistor, having a first terminal, a second terminal and a control terminal, wherein the first terminal of the second transistor is coupled to the second terminal of the first transistor, the second terminal of the second transistor is coupled to a second voltage, and the control terminal of the second transistor is configured to receive the first control signal; and
        a first resistive component, having a first terminal and a second terminal, wherein the first terminal of the first resistive component is coupled to the first terminal of the second transistor, and the second terminal of the first resistive component is coupled to the second terminal of the second transistor; and
    a main driver circuit, comprising a third transistor, having a first terminal, a second terminal and a control terminal, wherein the first terminal of the third transistor is configured to receive a power supply, the second terminal of the third transistor is configured to output a first output signal, and the control terminal of the third transistor is configured to receive the first pre-driving signal;
    wherein one of the first transistor and the second transistor is a P-type transistor, and the other is an N-type transistor; and
    wherein a voltage swing of the first pre-driving signal is smaller than a voltage difference between the first voltage and the second voltage.

5. The driving device of claim 4, wherein:
the first transistor and the third transistor are P-type transistors, and the second transistor is an N-type transistor; and
the first voltage is higher than the second voltage.

6. The driving device of claim 5, wherein:
when the first control signal is at a logic high level, the first transistor is turned off, the second transistor is turned on, a voltage of the first pre-driving signal equals to the second voltage, and the third transistor is turned on; and
when the first control signal is at a logic low level, the first transistor is turned on, the second transistor is turned off, and the voltage of the first pre-driving signal equals to a divisional voltage provided by the first resistive component and the first transistor, and the third transistor is turned off.

7. The driving device of claim 5, further comprising:
a second pre-driver circuit, configured to generate a second pre-driving signal according to a second control signal;
wherein:
the main driver circuit further comprises a fourth transistor, having a first terminal, a second terminal and a control terminal, the first terminal of the fourth transistor is configured to receive the power supply, the second terminal of the fourth transistor is configured to output a second output signal, and the control terminal of the fourth transistor is configured to receive the second pre-driving signal; and
the fourth transistor is a P-type transistor.

8. The driving device of claim 7, further comprising:
a third pre-driver circuit, configured to generate a third pre-driving signal according to the first control signal; and
a fourth pre-driver circuit, configured to generate a fourth pre-driving signal according to the second control signal;
wherein the main driver circuit further comprises:
a seventh transistor, having a first terminal, a second terminal and a control terminal, the first terminal of the seventh transistor is coupled to the second terminal of the third transistor, and the control terminal of the seventh transistor is configured to receive the third pre-driving signal; and
an eighth transistor, having a first terminal, a second terminal and a control terminal, the first terminal of the eighth transistor is coupled to the second terminal of the fourth transistor, and the control terminal of the eighth transistor is configured to receive the fourth pre-driving signal;
wherein the seventh transistor and the eighth transistor are N-type transistors.

9. The driving device of claim 7, wherein the second pre-driver circuit comprises:
a fifth transistor, having a first terminal, a second terminal and a control terminal, the first terminal of the fifth transistor is coupled to the first voltage, the second terminal of the fifth transistor is configured to output the second pre-driving signal, and the control terminal of the fifth transistor is configured to receive the second control signal;
a sixth transistor, having a first terminal, a second terminal and a control terminal, the first terminal of the sixth transistor is coupled to the second terminal of the fifth transistor, the second terminal of the sixth transistor is coupled to the second voltage, and the control terminal of the sixth transistor is configured to receive the second control signal; and
a second resistive component, having a first terminal and a second terminal, the first terminal of the second resistive component is coupled to the first terminal of the sixth transistor, and the second terminal of the second resistive component is coupled to the second terminal of the sixth transistor;
wherein the fifth transistor is a P-type transistor, and the sixth transistor is an N-type transistor.

10. The driving device of claim 9, wherein:
the first control signal and the second control signal are complementary; and
the first output signal and the second output signal are a pair of differential output signals.

11. The driving device of claim 10, wherein the third pre-driver circuit comprises:
a ninth transistor, having a first terminal, a second terminal and a control terminal, the first terminal of the ninth transistor is coupled to the first voltage, the second terminal of the ninth transistor is configured to output the third pre-driving signal, and the control terminal of the ninth transistor is configured to receive the first control signal;
a tenth transistor, having a first terminal, a second terminal and a control terminal, the first terminal of the tenth transistor is coupled to the second terminal of the ninth transistor, the second terminal of the tenth transistor is coupled to the second voltage, and the control terminal of the tenth transistor is configured to receive the first control signal; and
a third resistive component, having a first terminal and a second terminal, the first terminal of the third resistive component is coupled to the first terminal of the ninth transistor, and the second terminal of the third resistive component is coupled to the second terminal of the ninth transistor;
wherein ninth transistor is a P-type transistor, and the tenth transistor is an N-type transistor.

12. The driving device of claim 11, wherein:
when the first control signal is at a logic high level, the ninth transistor is turned off, the tenth transistor is turned on, the voltage of the third pre-driving signal equals to a divisional voltage provided by the third resistive component and the tenth transistor, and the seventh transistor is turned off; and
when the first control signal is at a logic low level, the ninth transistor is turned on, the tenth transistor is turned off, and the voltage of the third pre-driving signal equals to the first voltage, and the seventh transistor is turned on.

13. The driving device of claim 11, wherein:
a resistance of the first resistive component is higher than an on-resistance of the first transistor, and a resistance of the third resistive component is higher than an on-resistance of the tenth transistor.

14. The driving device of claim 10, wherein the fourth pre-driver circuit comprises:
an eleventh transistor, having a first terminal, a second terminal and a control terminal, the first terminal of the eleventh transistor is coupled to the first voltage, the second terminal of the eleventh transistor is configured to output the fourth pre-driving signal, and the control terminal of the eleventh transistor is configured to receive the second control signal;

a twelfth transistor, having a first terminal, a second terminal and a control terminal, the first terminal of the twelfth transistor is coupled to the second terminal of the eleventh transistor, the second terminal of the twelfth transistor is coupled to the second voltage, and the control terminal of the twelfth transistor is configured to receive the second control signal; and a fourth resistive component, having a first terminal and a second terminal, the first terminal of the fourth resistive component is coupled to the first terminal of the eleventh transistor, and the second terminal of the fourth resistive component is coupled to the second terminal of the eleventh transistor;

wherein the eleventh transistor is a P-type transistor, and the twelfth transistor is an N-type transistor.

15. The driving device of claim 14, wherein:

when the second control signal is at a logic high level, the eleventh transistor is turned off, the twelfth transistor is turned on, the fourth pre-driving signal the voltage of equals to a divisional voltage provided by the fourth resistive component and the twelfth transistor, and the eighth transistor is turned off; and when the second control signal is at a logic low level, the eleventh transistor is turned on, the twelfth transistor is turned off, and the fourth pre-driving signal the voltage of equals to the first voltage, and the eighth transistor is turned on.

16. The driving device of claim 10, further comprising:

a first current source, coupled to the first terminal of the third transistor and the first terminal of the fourth transistor; and a second current source, coupled to the second terminal of the seventh transistor and the second terminal of the eighth transistor;

wherein the first current source and the second current source are configured to generate currents having the same level for the power supply.

17. The driving device of claim 10, further comprising:

a first voltage source, coupled to the first terminal of the third transistor and the first terminal of the fourth transistor, configured to provide the power supply and the first voltage.

18. The driving device of claim 4, wherein the first resistive component comprises a variable resistor.

* * * * *